US006281765B1

(12) United States Patent
Hakki et al.

(10) Patent No.: US 6,281,765 B1
(45) Date of Patent: Aug. 28, 2001

(54) WIDE BAND ELECTRICAL DELAY LINE

(75) Inventors: Basil Wahid Hakki, Allentown; Ton Van Nguyen, Breinigsville, both of PA (US)

(73) Assignee: Agere Systems Optoelectronics Guardian Corp., Orlando, FL (US)

( * ) Notice: Subject to any disclaimer, the term of this patent is extended or adjusted under 35 U.S.C. 154(b) by 0 days.

(21) Appl. No.: 09/265,559

(22) Filed: Mar. 9, 1999

(51) Int. Cl.$^7$ .............................. H03H 7/30; H01D 9/00
(52) U.S. Cl. ..................... 333/156; 333/138; 333/140; 333/161; 333/164
(58) Field of Search ......................... 333/138, 139, 333/156, 157, 160, 161, 164, 245, 246, 248, 140

(56) References Cited

U.S. PATENT DOCUMENTS 3,781,722 * 12/1973 Pierson ............................ 333/109
3,852,689 * 12/1974 Watson ............................. 333/113
5,680,079 * 10/1997 Inami et al. ...................... 333/161

* cited by examiner

*Primary Examiner*—Robert Pascal
*Assistant Examiner*—Kimberly E Glenn
(74) *Attorney, Agent, or Firm*—William H. Bollman

(57) ABSTRACT

A non-mechanical electrically adjustable delay device which does not suffer from interruptions in impedance inherent in multiple-tap delay lines. The wide band electrical delay line is capable of delaying a wide band of signals without significant distortion, e.g., up into the microwave range, and allows continuous transmission of a signal between the input port and the output port. The exemplary wide band electrical delay line comprises two transmission lines, preferably parallel to one another, and having different propagation velocities. A plurality of electrical cross connect circuits are connected between the two transmission lines. The electrical cross connect circuits are spaced along the lengths of the two transmission lines, e.g., preferably to form evenly spaced distances therebetween. The total delay through the wide band electrical delay line is adjusted by selectively activating an appropriate one of the plurality of cross connect circuits between the two transmission lines. The wide band electrical delay line may include an equalizer circuit connected either to an output end of the output transmission line or to an input end of the input transmission line. The equalizer circuit preferably compensates for both any loss and/or distortion associated with the presence of all of the electrical cross connect circuits.

25 Claims, 4 Drawing Sheets

FIG. 3

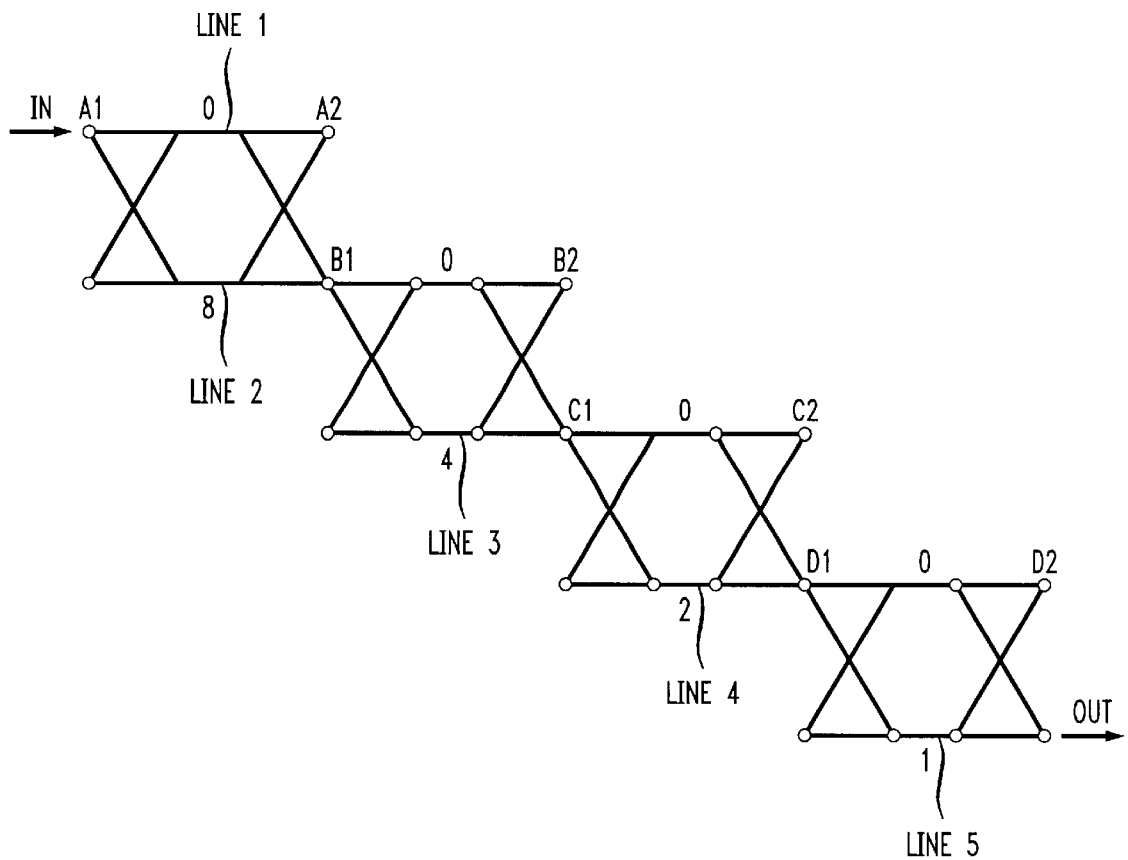

| DELAY | SWITCHES |
|---|---|
| 0 | A1 $\overline{A2}$ B1 $\overline{B2}$ C1 $\overline{C2}$ D1 $\overline{D2}$ |
| 1 | A1 $\overline{A2}$ B1 $\overline{B2}$ C1 $\overline{C2}$ $\overline{D1}$ D2 |
| 2 | A1 $\overline{A2}$ B1 $\overline{B2}$ $\overline{C1}$ C2 D1 $\overline{D2}$ |
| 3 | A1 $\overline{A2}$ B1 $\overline{B2}$ $\overline{C1}$ C2 $\overline{D1}$ D2 |
| 4 | A1 $\overline{A2}$ $\overline{B1}$ B2 C1 $\overline{C2}$ D1 $\overline{D2}$ |
| 5 | A1 $\overline{A2}$ $\overline{B1}$ B2 C1 $\overline{C2}$ $\overline{D1}$ D2 |
| 6 | A1 $\overline{A2}$ $\overline{B1}$ B2 $\overline{C1}$ C2 D1 $\overline{D2}$ |
| 7 | TWO CHOICES 8+1 OR 4+2+1 |
| 8 | $\overline{A1}$ A2 B1 $\overline{B2}$ C1 $\overline{C2}$ D1 $\overline{D2}$ |

ETC. UP TO MAXIMUM OF 15

| DELAY | SWITCHES | | | | |
|---|---|---|---|---|---|
| 0  | S1 | S2 | S3 | S4 | S̄5 |
| 1  | S1 | S2 | S3 | S̄4 | S5 |
| 2  | S1 | S2 | S̄3 | S̄4 | S̄5 |
| 3  | S1 | S2 | S̄3 | S4 | S5 |
| 4  | S1 | S̄2 | S̄3 | S4 | S̄5 |
| 5  | S1 | S̄2 | S̄3 | S̄4 | S5 |
| 6  | S1 | S̄2 | S3 | S̄4 | S̄5 |
| 7  | S1 | S̄2 | S3 | S4 | S5 |
| 8  | S̄1 | S̄2 | S3 | S4 | S̄5 |
| 9  | S̄1 | S̄2 | S3 | S̄4 | S5 |
| 10 | S̄1 | S̄2 | S̄3 | S̄4 | S̄5 |
| 11 | S̄1 | S̄2 | S̄3 | S4 | S5 |
| 12 | S̄1 | S2 | S̄3 | S4 | S̄5 |
| 13 | S̄1 | S2 | S̄3 | S̄4 | S5 |
| 14 | S̄1 | S2 | S3 | S̄4 | S̄5 |
| 15 | S̄1 | S2 | S3 | S4 | S5 |

SWITCH CODE
S̄ CLOSED
S OPEN

WIDE BAND ELECTRICAL DELAY LINE

BACKGROUND OF THE INVENTION

1. Field of the Invention

This invention relates generally to electrical delay lines. More particularly, it relates to an electrical (i.e., non-mechanical) delay line capable of delaying a band of signals without significant distortion.

2. Background of Related Art

Delay lines are devices used by circuit designers to delay a particular signal input a predetermined amount of time before being output at an appropriate output port. Ideally, a delay line delays an input signal independent of the input frequency (i.e., is non-dispersive).

Conventional delay lines have been mechanically adjustable coaxial devices which typically insert a center conductor into an outer conductor a predetermined amount to provide the desired delay. Such delay lines having an adjustable transit time are typically called a "trombone". Unfortunately, mechanics in any circuit causes concern for reduced reliability and increased cost of manufacture.

Another conventional type of delay line has a plurality of taps, each tap having a predetermined delay associated therewith. However, multiple-tap delay lines suffer from interruptions in the signal and impedance caused by each of the various taps between the input and the chosen tap output.

There is a need for a delay line which does not suffer from the disadvantages inherent in conventional electromechanical or multiple-tap delay lines.

SUMMARY OF THE INVENTION

In accordance with the principles of the present invention, an electrical delay line comprises a first transmission line having a first propagation velocity. A second transmission line has a second propagation velocity different from the first propagation velocity. A plurality of electrical cross connect circuits are between the first transmission line and the second transmission line.

A method of electrically adjusting a delay line in accordance with another aspect of the present invention comprises the provision of a first transmission line having a first plurality of segments. The first plurality of segments are connected by respective first transmission line switches. A second transmission line is provided having a second plurality of segments. The second plurality of segments are connected by respective second transmission line switches. An input segment of the first transmission line is selectably connected with an output segment of the second transmission line.

BRIEF DESCRIPTION OF THE DRAWINGS

Features and advantages of the present invention will become apparent to those skilled in the art from the following description with reference to the drawings, in which:

FIG. 3 shows an alternative arrangement using more than two transmission lines, in accordance with an alternative embodiment of the present invention.

DETAILED DESCRIPTION OF ILLUSTRATIVE EMBODIMENTS

The present invention provides a device having an electrically adjustable delay for an input signal which does not require mechanical adjustment to adjust the delay, and which does not suffer from interruptions in impedance inherent in multiple-tap delay lines.

The wide band electrical delay line in accordance with the principles of the present invention is capable of delaying a wide band of signals without significant distortion, e.g., up into the microwave range.

The wide band electrical delay line is operated in a manner that allows continuous transmission of a signal between the input port and the output port. Moreover, a delay is provided which is controlled electrically, i.e., by activating an appropriate one of a plurality of cross connect circuits between two transmission lines.

Figure 1:
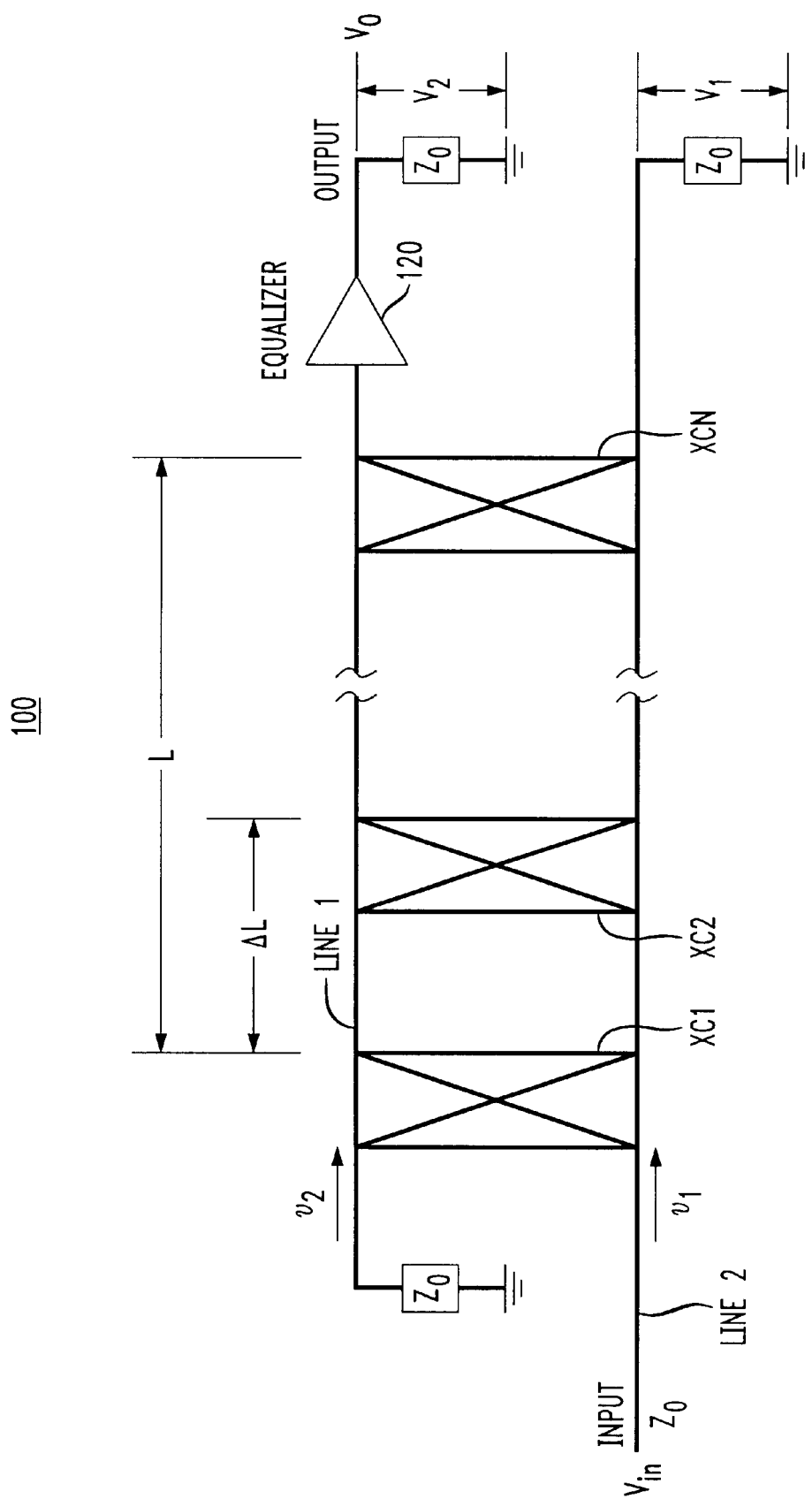
FIG. 1 shows an exemplary wide band electrical delay line constructed in accordance with the principles of the present invention.

FIG. 1 shows an exemplary wide band electrical delay line 100 in accordance with the principles of the present invention.

In particular, the wide band electrical delay line 100 comprises two transmission lines Line1, Line2. Preferably, the two transmission lines Line1, Line2 are parallel to one another, and each having a different propagation velocity $v_1$ and $v_2$, respectively.

In accordance with the principles of the present invention, a plurality N of electrical cross connect circuits XC are connected between the two transmission lines Line1, Line2. The electrical cross connect circuits XC are spaced along the lengths of the two transmission lines Line1, Line2, e.g., preferably to form evenly spaced distances $\Delta L$ therebetween.

The wide band electrical delay line 100 further preferably includes an equalizer circuit 120 connected to an output end of one of the transmission lines Line1. The equalizer circuit 120 preferably compensates for both a loss and a distortion associated with the presence of all of the cross connect circuits XC.

Each evenly spaced distance $\Delta L$ has an incremental delay $\Delta \tau$ associated therewith. The incremental delay $\Delta \tau$ can be represented as:

$$\Delta \tau = \Delta L \left( \frac{1}{v_1} - \frac{1}{v_2} \right)$$

Given that there are a plurality N of electrical cross connect circuits XC, the total delay $\tau$ can be represented as:

$$\tau = N \Delta \tau$$

Thus, in accordance with the principles of the present invention, the total delay $\tau$ as seen at the output port of the wide band electrical delay line can be adjusted in increments of $\Delta \tau$ by adjusting the number of segments of the delay line by activating the appropriate electrical cross connect circuit XC, e.g., between $0 \leq n \leq N$.

Preferably, each cross connect circuit XC is electrically controlled to allow adjustment of the total delay of the wide band electrical delay line 100. Moreover, each cross connect circuit XC is preferably RF matched to the two transmission lines Line1, Line2 in such a way that the signal transmission is continuous through the delay line, and RF matching is maintained.

In the disclosed embodiment, the two transmission lines Line1, Line2 have substantially the same characteristic impedance $Z_0$, e.g., 50 Ω, but have different propagation velocities $v_1$ and $v_2$, respectively.

For instance, the first transmission line Line1 may be formed as a microstrip line including a Teflon™ or similar type dielectric of thickness 1/16 inch and stripe width of 0.16 inches, providing a 50 Ω line having a propagation velocity $v_1=0.68c$, where c is the velocity of light in free space. The second transmission line Line2 may be a fiber glass microstrip having a width of 0.024 inches, a dielectric thickness of 0.025 inches, and a propagation velocity $v_2=0.385c$. Of course, these values are exemplary only. The principles of the present invention relate to two transmission lines having any particular form and propagation velocity.

Given these exemplary transmission lines Line1, Line2 having propagation velocities $v_1=0.68c$ and $v_2=0.385c$, the resultant time delay per unit length is 37 picoseconds per centimeter (ps/cm). Accordingly, the spacing ΔL between each of the electrical cross connect circuits XC can be adjusted to give any desired incremental delay Δτ. For example, with a spacing ΔL=0.53 cm, an incremental delay Δτ=20 ps results.

Similarly, the total available delay can be adjusted by adjusting the plurality N of electrical cross connect circuits XC and associated length of the two transmission lines Line1, Line2. For instance, in the given example with an incremental delay Δτ=20 ps, if N=5 then a total available delay would be 20 ps×5=100 ps.

Figure 2:
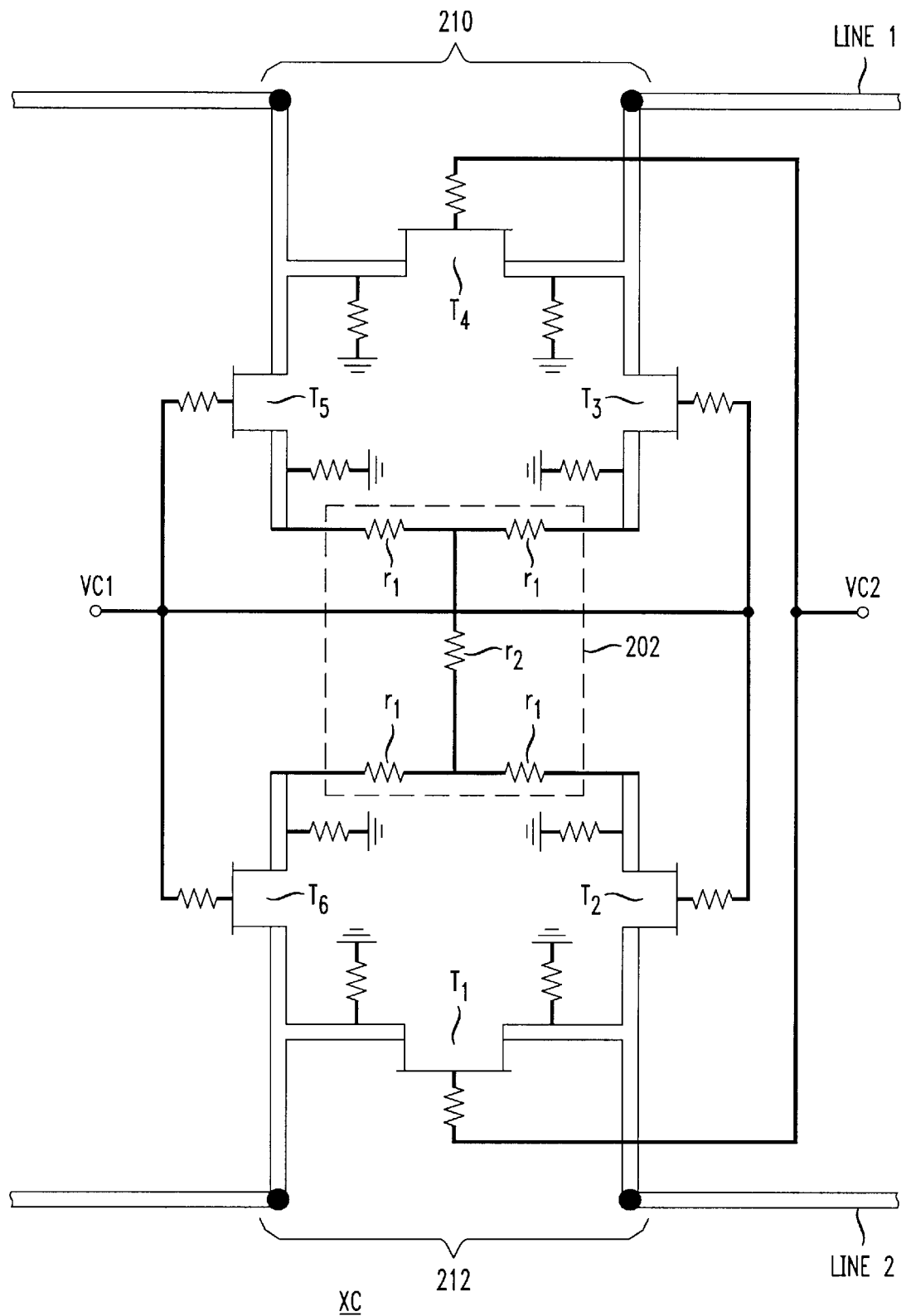
FIG. 2 shows an exemplary circuit diagram for each cross connect circuit between two transmission lines, each cross connect circuit comprising a radio frequency (RF) coupling resistive network and electrical switches.

FIG. 2 shows a schematic diagram of an exemplary electrical cross connect circuit XC. Each disclosed electrical cross connect circuit XC comprises a radio frequency (RF) coupling resistive network 202 and a plurality of electric switches $T_1$ to $T_6$.

In particular, the RF coupling resistive network 202 in FIG. 2 comprises five resistors $r_1$, $r_1$, $r_1$, $r_1$ and $r_2$ which, when connected to the two transmission lines Line1, Line2, couple power from a first transmission line Line2 receiving an input signal to a second transmission line Line1 leading toward the output port of the wide band electrical delay line 100. The RF coupling resistive network 202 also maintains impedance matching.

Impedance matching is achieved in the disclosed example with values of the resistors $r_1$ and $r_2$ ideally chosen to be $r_1=Z_0/3$ and $r_2=2Z_0/3$, respectively.

Switching in the exemplary electrical cross connect circuits XC is performed by six transistors $T_1$ to $T_6$ (e.g., GaAs field effect transistors (FETs)). Ideally, the six transistor switches $T_1$ to $T_6$ have low parasitics (e.g., a shunt capacitance C<=0.06 picoFarads (pF), and a series resistance $R_s \leq 2Ω$ when closed). One transistor switch $T_1$ breaks or enables passage through one transmission line Line1 at the relevant node 212, while a second transistor switch $T_4$ breaks or enables passage through the other transmission line Line2. Transistor switches $T_3$ and $T_6$ selectably provide an electrical connection between the input side of one transmission line Line2 and the output side of the other transmission line Line1, while transistor switches $T_2$ and $T_5$ provide an electrical connection between the impedance matched ends of both transmission lines Line1, Line2.

Control of the electrical cross connect circuits XC is accomplished by applying the appropriate control voltages VC1 and VC2 to the gates of the transistors $T_1$ to $T_6$. Control voltage VC1 controls transistors $T_2$, $T_3$, $T_5$ and $T_6$, while control voltage VC2 controls transistors $T_1$ and $T_4$. When control voltage VC1 is at a logic HIGH level, e.g., 0 volts, transistors $T_2$, $T_3$, $T_5$ and $T_6$ are ON, and when the control voltage VC1 is at a logic LOW level, e.g., −5 volts, transistors $T_2$, $T_3$, $T_5$ and $T_6$ are OFF. Similarly, when the control voltage VC2 is at a logic HIGH, transistors $T_1$ and $T_4$ are ON, and when at a logic LOW level, transistors $T_1$ and $T_4$ are OFF.

As an example, when the control voltages VC1=0 and VC2=−5 volts, transistors $T_1$ and $T_4$ are open or OFF while transistors $T_2$,$T_3$,$T_5$ and $T_6$ are closed or ON, causing the two transmission lines Line1, Line2 to be connected together at the points 212, 210, respectively.

When the two transmission lines Line1, Line2 are connected together at the nodes 210, 212 corresponding to a particular electrical cross connect circuit XC, an input signal voltage $V_{in}$ input into transmission line Line2 is split into three signals. A signal voltage $V_{in}/2$ is transmitted through the electrical cross connect circuit XC on transmission line Line2, and two signals with respective voltages $V_{in}/4$ are launched in opposite directions on transmission Line1.

Conversely, when the control voltages are, e.g., VC1=−5 volts and VC2=0 volts, transistor switches $T_1$ and $T_4$ are closed (i.e., ON), and transistor switches $T_2$, $T_3$, $T_5$ and $T_6$ are open (i.e., OFF). Hence, the two transmission lines Line1, Line2 are not connected by that particular electrical cross connect circuit XC, and whatever signals are propagating in the respective transmission lines Line1, Line2 pass through the closed (i.e., ON) transistor switches.

Several features of a wide band electrical delay line in accordance with the disclosed embodiment are noteworthy. For instance, regardless of which electrical cross connect circuit XC couples the two transmission lines Line1, Line2, the input signal $V_{in}$ goes through the same number of transistor switches. Therefore, if all electrical cross connect circuits XC are identical (as in the exemplary embodiment), any distortion of the signal due to dispersive loss and reactance through the wide band electrical delay line 100 is independent of the delay. Moreover, the impedance of each transmission line Line1, Line2 at any point is $Z_0$ regardless of the status of the adjacent electrical cross connect circuit XC. Both of these features have useful implications.

For instance, only one equalizer circuit 120 may be necessary at either the input point of the input transmission line Line2 or at the output point of the output transmission line Line1 to compensate for any waveform distortion associated with parasitics relating to the electrical cross connect circuits XC.

In addition, when adjusting the total delay time through the wide band electrical delay line 100, an adjacent electrical cross connect circuit XC can be turned ON or activated before the previously set electrical cross connect circuit XC is turned OFF or deactivated. This maintains signal flow at the output of the wide band electrical delay line 100 without creating an impedance mismatch. However, while the two adjacent electrical cross connect circuits XC are turned ON, the signal output from the output port will comprise two signals, one being half the voltage of the other and delayed by the incremental delay Δτ. If, for instance, the incremental delay Δτ is chosen to be a small fraction of a single bit in a digital application (e.g. 20%), the temporary ISI effect should be negligible.

The particular circuitry of the described wide band electrical delay line 100 can be modified depending upon the particular application. For instance, FIG. 3 shows an alternative arrangement using more than two transmission lines, e.g., transmission lines Line1 to Line5.

In particular instead of a cascade of N equally spaced electrical cross connect circuits XC, the desired delay can be achieved by a series of segments whose individual values of delay are progressively reduced by a factor of 2. For N such segments, the smallest delay is $2^{-N}$ of the largest segment, while the total number of electrical cross connect circuits XC is 2N.

In the example of FIG. 3, N=4, and the largest segment has a delay of 8 units (a unit being an arbitrary amount of time).

For fine tuning with a minimum number of electrical cross connect circuits XC, this may be an attractive option. However for transmission purposes, the switching logic may be more complicated where adjustment is made semi-continuously.

The utility of FIG. 3 is that the delay can be fine tuned, and for any chosen delay, half of the switches are open and half of the switches are closed. This makes any dispersive loss or phase distortion associated with the switches constant, and hence an equalizer will be effective in restoring the signal as in FIG. 1.

Figure 4:
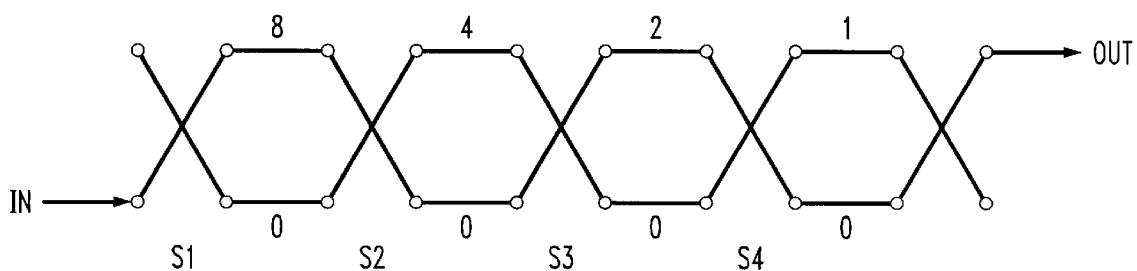
FIG. 4 shows another alternative embodiment comprising a simpler, more economical configuration which is useful if spurious loss or dispersion of switches is unimportant to the particular application.

If the spurious loss or dispersion of switches is unimportant, then a simpler and more economical configuration as shown in FIG. 4 may be implemented. FIG. 4 shows another alternative embodiment which is useful if spurious loss or dispersion of switches is unimportant to the particular application.

In particular, in FIG. 4, the adjustment of delay is performed as shown by the included switching table. In FIG. 4, as opposed to FIG. 3, a different number of switches are either opened or closed to provide the required delay. Hence, a simple equalizer will not be as effective in compensating for spurious distortion.

For large bandwidth applications, e.g., in excess of 5 gigahertz (GHz), the circuitry relating to a wide band electrical delay line (e.g., as shown in FIGS. 2, 3 or 4) is preferably formed in an integrated circuit (IC), to provide superior high frequency performance.

A wide band electrical delay line constructed in accordance with the principles of the present invention has numerous applications, e.g., in PMD compensating schemes and other Gb/s transmission equipment.

While the invention has been described with reference to the exemplary embodiments thereof, those skilled in the art will be able to make various modifications to the described embodiments of the invention without departing from the true spirit and scope of the invention.

What is claimed is:

1. An electrical delay line, comprising:

a first continuous transmission line having a first propagation velocity;

a second continuous transmission line having a second propagation velocity different from said first propagation velocity; and at least three electrical cross connect circuits between said first continuous transmission line and said second continuous transmission line;

wherein at least one of said at least three electrical cross connect circuits are activated to allow adjustment of a total delay of said electrical delay line.

2. The electrical delay line according to claim 1, wherein:

said first transmission line is parallel to said second transmission line.

3. An electrical delay line comprising:

a first continuous transmission line having a first propagation velocity;

a second continuous transmission line having a second propagation velocity different from said first propagation velocity; and at least three electrical cross connect circuits between said first continuous transmission line and said second continuous transmission line;

wherein said at least three electrical cross connect circuits are connected to respective nodes of said first continuous transmission line and said second continuous transmission line, said respective nodes on each of said first continuous transmission line and said second continuous transmission line being separated by approximately equally spaced distances.

4. An electrical delay line comprising:

a first continuous transmission line having a first propagation velocity;

a second continuous transmission line having a second propagation velocity different from said first propagation velocity; and at least three electrical cross connect circuits between said first continuous transmission line and said second continuous transmission line;

an equalizer circuit in communication with an output of said first continuous transmission line;

wherein said equalizer circuit is adapted to compensate for at least one of a loss and a distortion associated with said at least three electrical cross connect circuits.

5. An electrical delay line comprising:

a first continuous transmission line having a first propagation velocity;

a second continuous transmission line having a second propagation velocity different from said first propagation velocity; and at least three electrical cross connect circuits between said first continuous transmission line and said second continuous transmission line;

an equalizer circuit in communication with an input of said second continuous transmission line;

wherein said equalizer circuit is adapted to compensate for at least one of a loss and a distortion associated with said at least three electrical cross connect circuits.

6. An electrical delay line comprising:

a first continuous transmission line having a first propagation velocity;

a second continuous transmission line having a second propagation velocity different from said first propagation velocity; and at least three electrical cross connect circuits between said first continuous transmission line and said second continuous transmission line;

an RF coupling resistive network; and a plurality of electric switches adapted to allow passage of current through said RF coupling resistive network from an input portion of said second continuous transmission line to an output portion of said first continuous transmission line.

7. An electrical delay line comprising:

a first continuous transmission line having a first propagation velocity;

a second continuous transmission line having a second propagation velocity different from said first propagation velocity; at least three electrical cross connect circuits between said first continuous transmission line and said second continuous transmission line; and a plurality of electric switches adapted to allow passage of current through an RF coupling resistive network from an impedance matched portion of said first continuous transmission line to an impedance matched portion of said second continuous transmission line.

8. An electrical delay line comprising:

a first continuous transmission line having a first propagation velocity;

a second continuous transmission line having a second propagation velocity different from said first propagation velocity; and at least three electrical cross connect circuits between said first continuous transmission line and said second continuous transmission line.

9. A method of electrically adjusting a delay line, comprising:

providing a first continuous transmission line having a first plurality of connected segments;

providing a second continuous transmission line having a second plurality of connected segments; and selectably connecting an input segment of said first continuous transmission line with an output segment of said second continuous transmission line with at least one of at least three electrical cross connect circuits therebetween to allow adjustment of said delay line based on a number of said first plurality of segments and a number of said second plurality of segments between said selected electrical cross connect circuits.

10. The method of electrically adjusting a delay line according to claim 9, wherein:

said first plurality is equal to said second plurality.

11. A method of electrically adjusting a delay line, comprising:

providing a first continuous transmission line having a first plurality of connected segments;

providing a second continuous transmission line having a second plurality of connected segments;

selectably connecting an input segment of said first continuous transmission line with an output segment of said second continuous transmission line with at least one of at least three electrical cross connect circuits therebetween; and selectably connecting impedance matched segments of said first continuous transmission line with impedance matched segments of said second continuous transmission line.

12. A method of electrically adjusting a delay line, comprising:

providing a first transmission line having a first plurality of segments, said first plurality of segments being connected by respective first transmission line transistors;

providing a second transmission line having a second plurality of segments, said second plurality of segments being connected by respective second transmission line transistors; and selectably connecting an input segment of said first transmission line with an output segment of said second transmission line;

wherein said first transmission line segments have a first propagation velocity; and said second transmission line segments have a second propagation velocity different from said first propagation velocity.

13. The method of electrically adjusting a delay line according to claim 12, wherein:

said transistors are field effect transistors.

14. A method of electrically adjusting a delay line, comprising:

providing a first continuous transmission line having a first plurality of connected segments;

providing a second continuous transmission line having a second plurality of connected segments; and selectably connecting an input segment of said first continuous transmission line with an output segment of said second continuous transmission line with at least one of at least three electrical cross connect circuits therebetween;

wherein said segments are of approximately equal length.

15. Apparatus for electrically adjusting a delay line, comprising:

first continuous transmission line means including a first plurality of connected segments;

second continuous transmission line means including a second plurality of connected segments; and means for selectably connecting an input segment of said first continuous transmission line means with an output segment of said second continuous transmission line means with at least one of at least three means for electrically cross connecting therebetween to allow adjustment of said delay line based on a number of said first plurality of segments and a number of said second plurality of segments between said selected electrical cross connect circuits.

16. The apparatus for electrically adjusting a delay line according to claim 15, wherein:

said first plurality is equal to said second plurality.

17. Apparatus for electrically adjusting a delay line, comprising:

first continuous transmission line means including a first plurality of connected segments;

second continuous transmission line means including a second plurality of connected segments;

means for selectably connecting an input segment of said first continuous transmission line means with an output segment of said second continuous transmission line means with at least one of at least three means for electrically cross connecting therebetween; and means for selectably connecting impedance matched segments of said first continuous transmission line means with impedance matched segments of said second continuous transmission line means.

18. Apparatus for electrically adjusting a delay line, comprising:

first transmission line means including a first plurality of segments, said first plurality of segments being connected by respective first transmission line transistors;

second transmission line means including a second plurality of segments, said second plurality of segments being connected by respective second transmission line transistors; and means for selectably connecting an input segment of said first transmission line means with an output segment of said second transmission line means;

wherein said first transmission line segments have a first propagation velocity; and said second transmission line segments have a second propagation velocity different from said first propagation velocity.

19. The apparatus for electrically adjusting a delay line according to claim 18, wherein:

said transistors are field effect transistors.

20. Apparatus for electrically adjusting a delay line, comprising:

first continuous transmission line means including a first plurality of connected segments;

second continuous transmission line means including a second plurality of connected segments; and means for selectably connecting an input segment of said first continuous transmission line means with an output segment of said second continuous transmission line means with at least one of at least three electrical cross connect circuits therebetween;

said segments are of approximately equal length.

21. A method of adjusting an electrical delay line, comprising:

providing a first continuous transmission line having a first propagation velocity;

providing a second continuous transmission line having a second propagation velocity different from said first propagation velocity;

providing at least three electrical cross connect circuits electrically connected to said first continuous transmission line and to said second continuous transmission line; and electrically controlling said at least three electrical cross connect circuits to allow adjustment of a total delay of said electrical delay line.

22. The method of adjusting an electrical delay line according to claim 21, further comprising:

connecting said at least three electrical cross connect circuits to respective nodes of said first continuous transmission line and said second continuous transmission line, said respective nodes on each of said first continuous transmission line and said second continuous transmission line being separated by approximately equally spaced distances.

23. The method of adjusting an electrical delay line according to claim 21, further comprising:

equalizing an output of said first continuous transmission line to compensate for at least one of a loss and a distortion associated with utilized ones of said at least three electrical cross connect circuits.

24. The method of adjusting an electrical delay line according to claim 21, further comprising:

equalizing an input of said second continuous transmission line to compensate for at least one of a loss and a distortion associated with utilized ones of said plurality of at least three electrical cross connect circuits.

25. The method of adjusting an electrical delay line according to claim 21, wherein:

said first continuous transmission line is parallel to said second continuous transmission line.

* * * * *